(12) United States Patent
Takahashi (10) Patent No.: US 8,018,779 B2
(45) Date of Patent: Sep. 13, 2011

(54) SEMICONDUCTOR STORAGE DEVICE

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 146 days.

(21) Appl. No.: 12/461,464

(22) Filed: Aug. 12, 2009

(65) Prior Publication Data

US 2010/0046306 A1    Feb. 25, 2010

(30) Foreign Application Priority Data

Aug. 21, 2008  (JP) ................................ 2008-212691
Apr. 23, 2009  (JP) ................................ 2009-104771

(51) Int. Cl.
*G11C 11/34*    (2006.01)
(52) U.S. Cl. ................ 365/185.25; 365/222; 365/185.21
(58) Field of Classification Search ............. 365/185.25, 365/222, 185.21
See application file for complete search history.

(56) References Cited

U.S. PATENT DOCUMENTS 6,480,433 B2 *  11/2002  Huffman ...................... 365/201

FOREIGN PATENT DOCUMENTS

JP        08-297974        11/1996

* cited by examiner

*Primary Examiner* — Jason Lappas
(74) *Attorney, Agent, or Firm* — Foley & Lardner LLP (57) ABSTRACT

It has been conventionally difficult to make circuits operate faster. The present invention is a semiconductor storage device including a reference voltage circuit that supplies a reference voltage, and first and second memory circuits, that performs a read/write operation when one of the first and second memory circuits is selected, wherein the first and second memory circuits each include a plurality of memory cells, a plurality of bit line pairs, a precharge circuit that connects a reference voltage circuit to a plurality of bit lines, a sense amplifier circuit that amplifies, when making a selection, a plurality of bit line pairs and a pull-down circuit that lowers any one of the plurality of bit line pairs below the reference voltage, the pull-down circuit of the second memory circuit lowers the bit line pair for a read/write operation period during which the first and second memory circuits are selected or non-selected and the precharge circuits of the first and second memory circuits connect a plurality of bit line pairs to the reference voltage circuit respectively during a precharge period.

8 Claims, 10 Drawing Sheets

SEMICONDUCTOR STORAGE DEVICE

This application claims priority to Japanese Applications No. 2008-212691, filed Aug. 21, 2008 and No. 2009-104771, filed Apr. 23, 2009, the disclosures of which are hereby incorporated by reference in their entirety.

BACKGROUND OF THE INVENTION

1. Field of the Invention

The present invention relates to a semiconductor storage device.

2. Description of the Related Art

Figure 7:
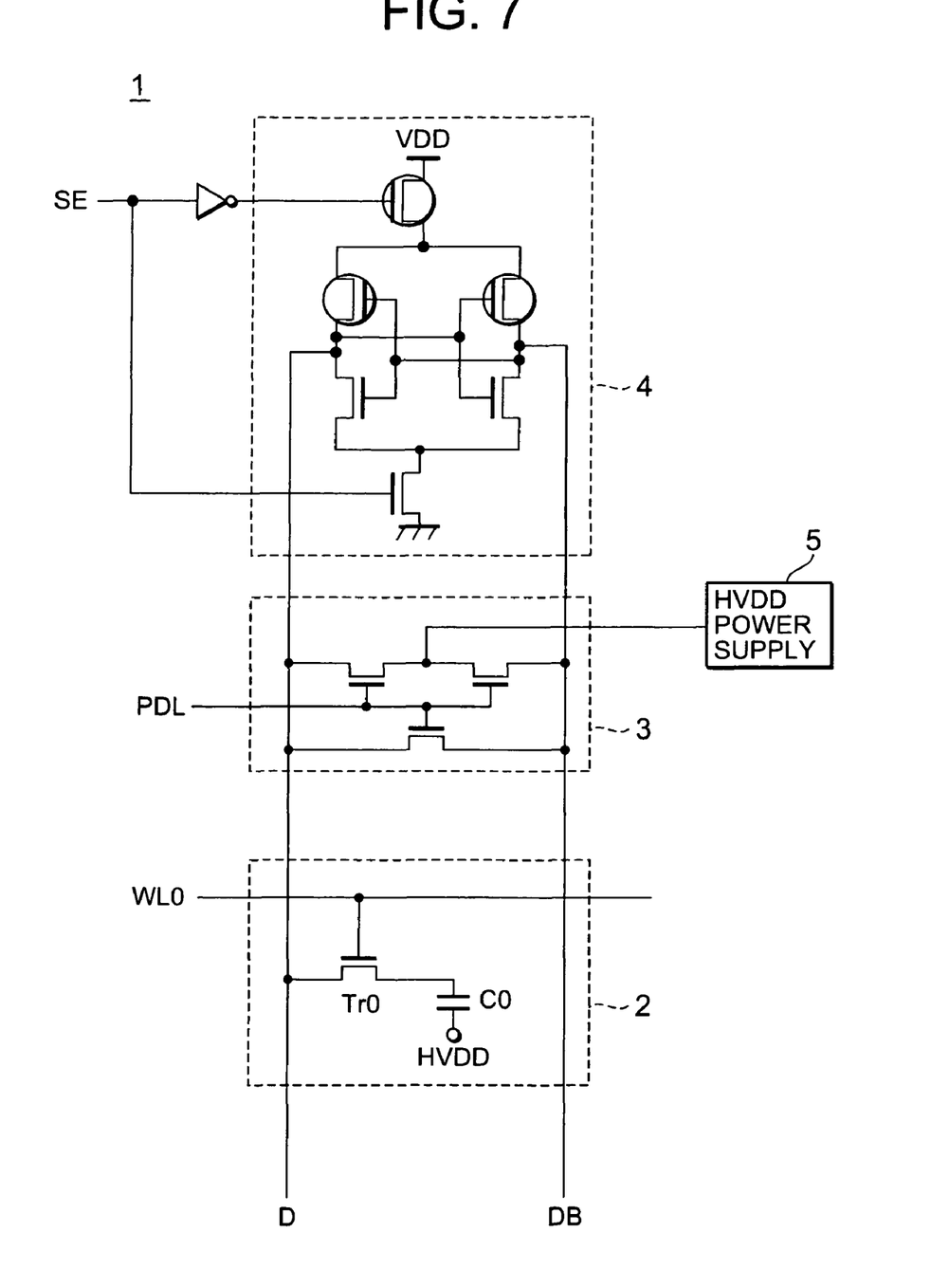
FIG. 7 is an example of a configuration of a conventional semiconductor storage device.

Conventionally, there is a half VDD (HVDD) precharge scheme adopting a voltage ½ of a power supply potential VDD as a precharge voltage of a bit line. FIG. 7 shows a circuit configuration of DRAM (Dynamic Random Access Memory) based on a general HVDD precharge scheme. As shown in FIG. 7, a DRAM circuit 1 has a memory cell 2, a precharge circuit 3, a sense amplifier 4, an HVDD power supply 5 and a bit line pair D, DB. The HVDD power supply 5 that supplies a potential ½ of the power supply potential VDD (hereinafter described as "½ VDD") is connected to the precharge circuit 3. The precharge circuit 3 precharges the bit line pair D, DB to ½ VDD during a precharge operation. Suppose this ½ VDD is a reference voltage.

Figure 8:
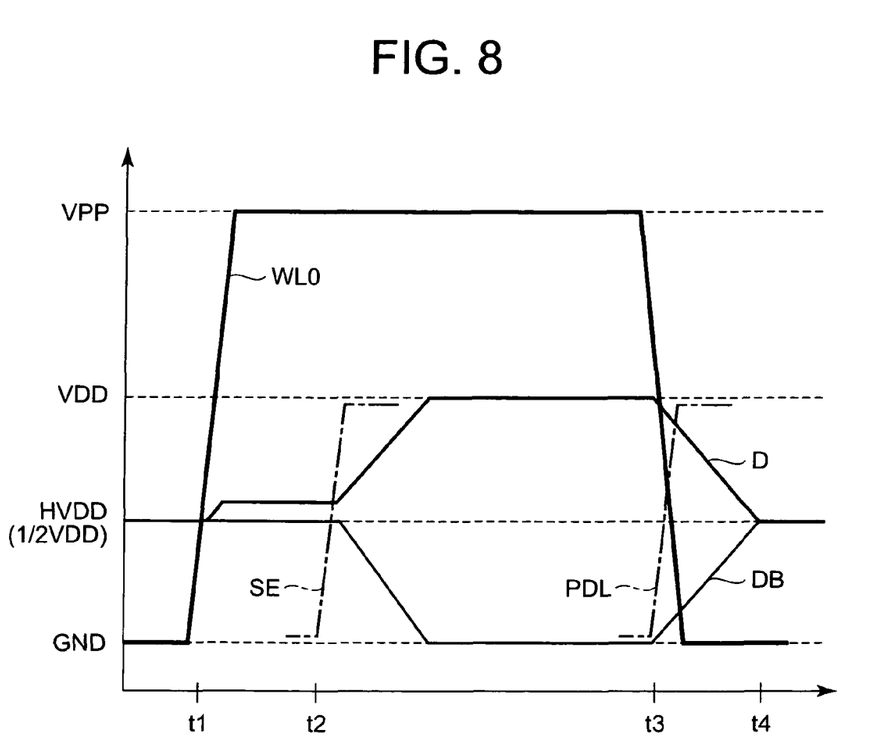
FIG. 8 is a waveform diagram of operation of the conventional semiconductor storage device.

Operations of the DRAM circuit 1 will be explained briefly using FIG. 8. In this example, suppose high level data is stored in the memory cell 2. For convenience' sake, suppose symbols "WL0," "SE" and "PDL" denote their respective wiring names and at the same time denote signal names outputted to the wirings. Suppose the same will apply to other wirings hereinafter.

First, before time t1, a word line signal WL0, a sense amplifier control signal SE and a precharge control signal PDL are at low levels respectively. Therefore, a memory cell transistor TrO of the memory cell 2 is OFF and operations of the sense amplifier 4 and precharge circuit 5 are stopped. Furthermore, a bit line pair DO, DBO has already been equalized and precharged and their respective potentials are set to ½ VDD.

At time t1, the word line signal WL0 is driven high. This causes the memory cell transistor TrO to turn ON and causes the charge of a memory cell capacitor C0 to be transmitted to the bit line DO. The potential of the bit line DO then slightly rises above the reference voltage. A voltage VPP, which is higher than the power supply voltage VDD, is supplied as the potential of the word line signal WL0 in this case. This is intended to ensure that the memory cell transistor TrO is held in an ON state.

At time t2, the sense amplifier control signal SE is driven high and the sense amplifier 4 operates. This causes the potential difference between the bit line pair DO, DBO to be amplified. This potential difference is read by an external circuit and becomes output data of the DRAM circuit 1.

At time t3, the word line signal WL0 is driven low and the precharge control signal PDL is driven high. This causes the memory cell transistor TrO to turn OFF and causes the precharge circuit 3 to start a precharge operation.

At time t4, the precharge operation of the precharge circuit 3 causes the bit line pair DO, DBO to be equalized and precharged and their respective potentials become ½ VDD.

However, the DRAM circuit 1 based on such an HVDD precharge scheme has the following problems. First, the cell capacitor C0 is connected to one of the drain and the source of the cell transistor TrO. Therefore, when high level data is held in the memory cell, the charged charge of the cell capacitor C0 leaks out on a back bias (normally, grounding potential) side of the cell transistor TrO. Therefore, when the memory cell transistor TrO turns ON, a potential rise from ½ VDD of the bit line DO becomes smaller by the amount of leaked charge. With circuit miniaturization in recent years, this problem is becoming increasingly noticeable. On the contrary, when low level data is held in the memory cell, the above described leakage of charge does not occur, and therefore there is no problem with data holding characteristics. That is, the margin of the data holding characteristics of the memory cell depends on the degree of rise of the potential of the bit line from the reference voltage when high level data is read. This margin is increased by lowering the reference voltage.

Next, miniaturization of manufacturing processes causes the gate breakdown voltage of the memory cell transistor TrO to decrease. This prevents the potential of the voltage VPP from increasing when the word line signal WL0 is driven high. This results in insufficient writing of the high level potential to the cell capacitor C0 when high level data is written to the memory cell 2.

Furthermore, during operation of the sense amplifier 4, both the PMOS transistor and NMOS transistor making up the sense amplifier 4 are given only ½ VDD as their gate voltages. Therefore, when the power supply voltage VDD drops, it approximates to a threshold voltage of the transistor, causing the operating voltage of the sense amplifier 4 to become insufficient. This makes it difficult for the sense amplifier 4 to operate. This constitutes a disadvantage to a power supply voltage which tends to decrease in recent years.

Figure 9:
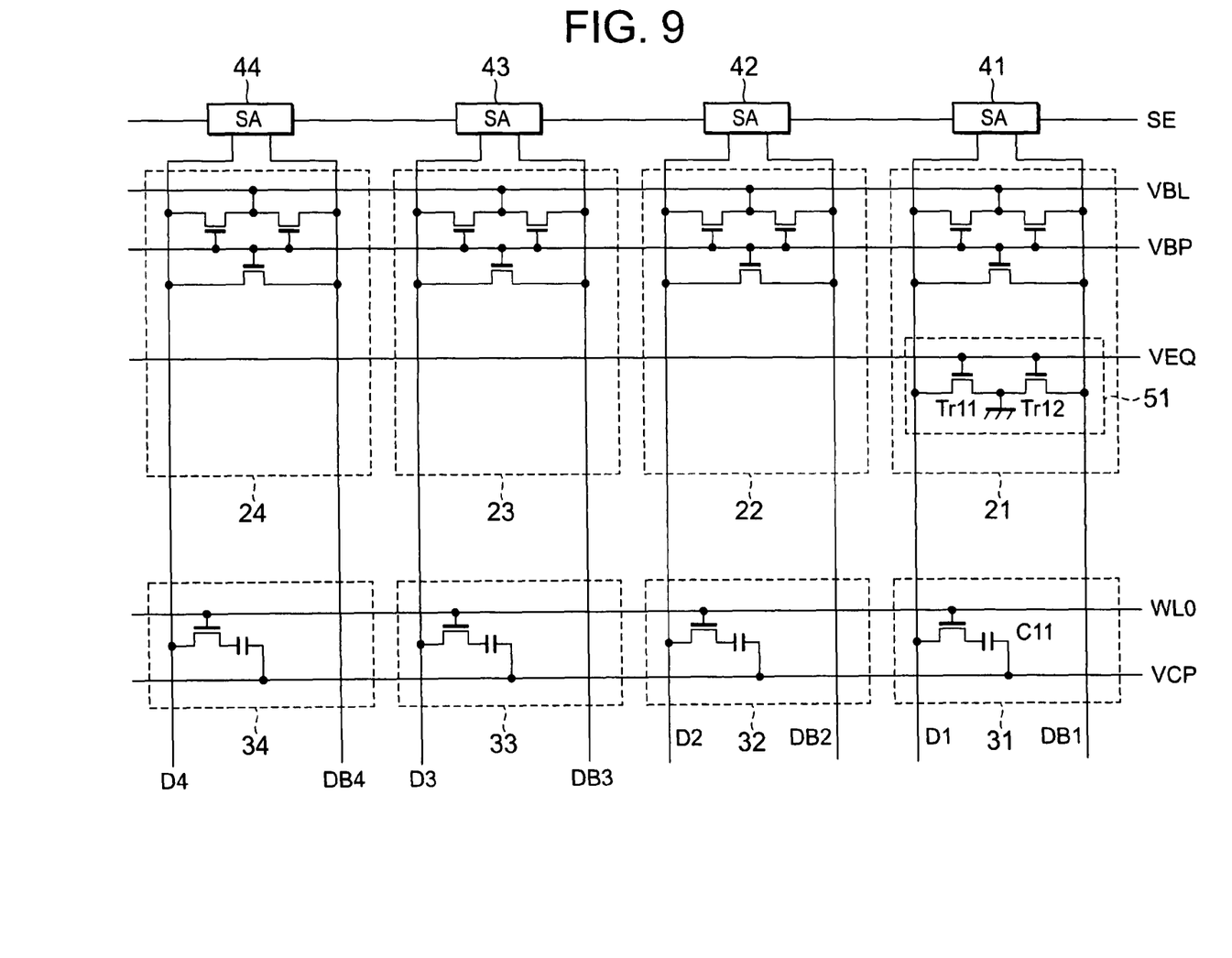
FIG. 9 is an example of a configuration of the conventional semiconductor storage device.

To cope with such a problem, scheme for making the reference voltage lower than ½ VDD are being developed. Lowering the reference voltage allows a margin of data holding characteristics of the memory cell to increase when holding high level data. One example of such a technique is the technique described in Japanese Patent Laid-Open No. 8-297974. FIG. 9 shows a configuration of a semiconductor storage device 10 of Japanese Patent Laid-Open No. 8-297974. As shown in FIG. 9, a semiconductor storage device 10 has precharge circuits 21 to 24, memory cells 31 to 34 and sense amplifiers 41 to 44. A precharge control signal VBP is inputted to the precharge circuits 21 to 24 respectively. A word line signal WL0 is inputted to the memory cells 31 to 34 respectively. A sense amplifier control signal SE is inputted to the sense amplifiers 41 to 44 respectively. The precharge circuit 21, memory cell 31 and sense amplifier 41 are each connected to a bit line pair D1, DB1. The precharge circuits 22 to 24, memory cells 32 to 34 and sense amplifiers 42 to 44 are likewise connected to bit line pairs D2, DB2 to D4, DB4 respectively. However, only the precharge circuit 21 has a pull-down circuit 51. The pull-down circuit 51 has NMOS transistors Tr11 and Tr12. The NMOS transistors Tr11 and Tr12 are connected between the bit line pair D1 and a grounding voltage GND and between DB1 and the grounding voltage GND respectively. ON/OFF of the NMOS transistors Tr11 and Tr12 is controlled by an equalizing control signal VEQ inputted to their gates.

Figure 10:
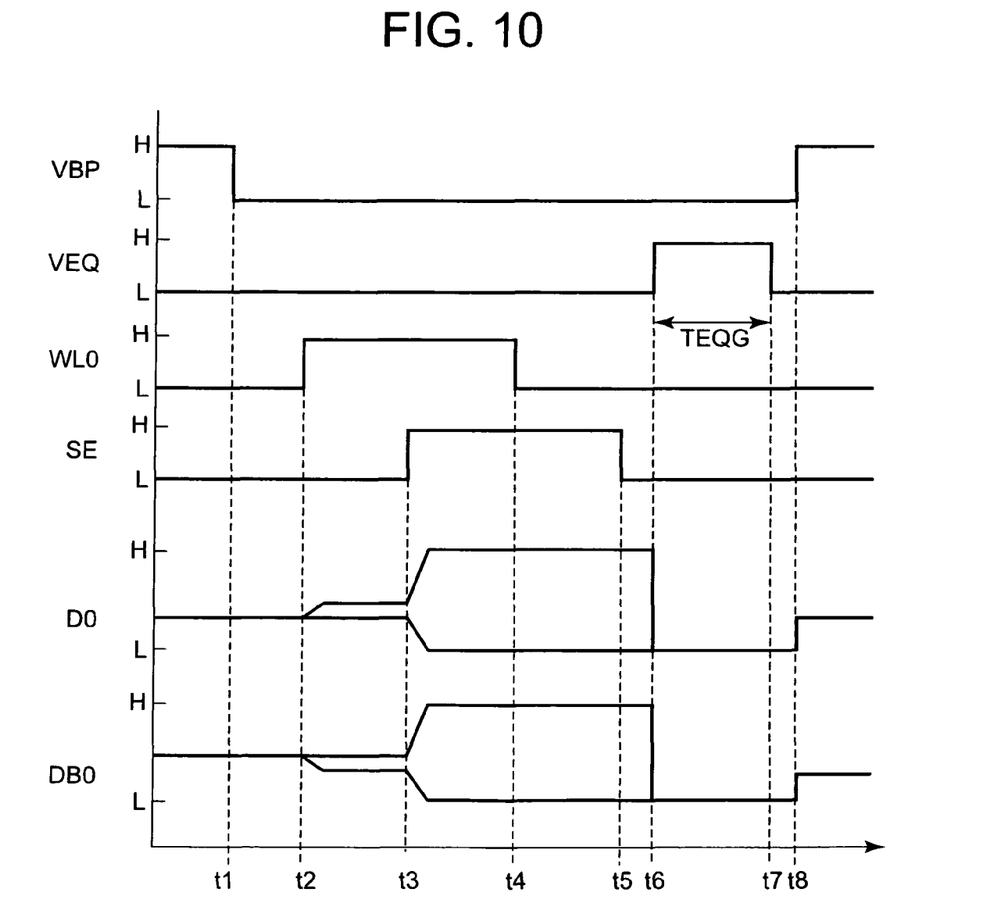
FIG. 10 is a timing chart of operation of the conventional semiconductor storage device.

Operations of the semiconductor storage device 10 will be explained briefly using FIG. 10. In this example, suppose high level data is held in a memory cell capacitor C11. At time t1, the precharge control signal VBP is driven low. By this time, the respective bit line pairs D1, DB1 to D4, DB4 have been precharged to a voltage VBL.

During time t2 to t4, the word line signal WL0 is held high. This causes the data held in the memory cells 31 to 34 to be read to the bit line pairs D1, DB1 to D4, DB4. During time t3 to t5, the sense amplifier control signal SE is held high, which causes the sense amplifiers 41 to 44 to operate. The sense amplifiers 41 to 44 amplify the data read to the respective bit lines. Of the read data, data of a selected bit line pair is read to an external circuit and becomes output data of the semiconductor storage device 10.

During time t6 to t7 (period TEQG), the equalizing control signal VEQ is held high. This causes the potential of the bit line pair D1, DB1 to become a grounding potential GND. At time t8, the precharge control signal VBP is driven high. This causes precharging and equalizing to be performed. The precharging and equalizing operations cause all bit line pairs D1, DB1 to D4, DB4, that is, a total of eight bit lines to be connected via the precharge control signal line and cause charge to be shared. As a result, since the bit line pair D1, DB1 is discharged, the potentials of eight bit lines become ⅜ VDD, which is lower than ½ VDD. Using this ⅜ VDD as a reference voltage avoids the above described problem.

In order to cause the reference voltage to fall below ½ VDD, the semiconductor storage device 10 of Japanese Patent Laid-Open No. 8-297974 connects the bit line pair D1, DB1 to the grounding potential GND so as to produce a discharge. This requires a period TEQG in FIG. 10 in addition to a one-cycle operation of normal read/write and provides a disadvantage in making the semiconductor storage device operate faster.

SUMMARY OF THE INVENTION

An aspect of the present invention is a semiconductor storage device including a reference voltage circuit that supplies a reference voltage, a first memory circuit connected to a first word line and a second memory circuit connected to a second word line, that performs a read/write operation when any one of the first memory circuit and the second memory circuit is selected, wherein the first memory circuit and the second memory circuit each include a plurality of memory cells, a plurality of bit line pairs for reading data stored in the plurality of memory cells, a precharge circuit that connects the reference voltage circuit and the plurality of bit lines to precharge the plurality of bit line pairs, a sense amplifier circuit that amplifies, when making a selection, potential differences among the plurality of bit line pairs and a pull-down circuit that lowers any one of the plurality of bit line pairs to a pull-down voltage, which is lower than the reference voltage, for a read/write operation period during which the first memory circuit is selected and the second memory circuit is non-selected, the pull-down circuit of the second memory circuit lowers the bit line pair to the pull-down voltage, and for a precharge period after the read/write operation period, the precharge circuits of the first memory circuit and the second memory circuit connect the plurality of bit line pairs to the reference voltage circuit respectively.

Another aspect of the present invention is a semiconductor storage device provided with a selected first sense amplifier, a first bit line pair coupled with the first sense amplifier, a first memory cell coupled with any one of the first bit line pair, a first word line coupled with the first memory cell, a first equalizing circuit coupled with the first bit line pair, a non-selected second sense amplifier, a second bit line pair coupled with the second sense amplifier, a second memory cell coupled with any one of the second bit line pair, a second word line coupled with the second memory cell, a second equalizing circuit coupled between the second bit line pair, a pull-down circuit coupled with the second bit line pair, and a control circuit that activates the pull-down circuit before the first sense amplifier is activated and simultaneously activates the first equalizing circuit and the second equalizing circuit for any period other than the period during which the pull-down circuit is activated.

In accordance with the semiconductor storage device according to the present invention, the voltage of the bit line pair of the non-selected second memory circuit is lowered to a pull-down voltage for a read/write operation period. The bit line pair of the first memory circuit selected for a precharge period is connected to the bit line pair of the non-selected second memory circuit and charge sharing is performed. This eliminates the necessity for the selected first memory circuit to perform operation of lowering the bit line pair to the pull-down voltage.

The present invention can improve data holding characteristics while preventing the speed of the semiconductor storage device from decreasing.

DETAILED DESCRIPTION OF THE PREFERRED EMBODIMENTS

Embodiment 1

Figure 1:
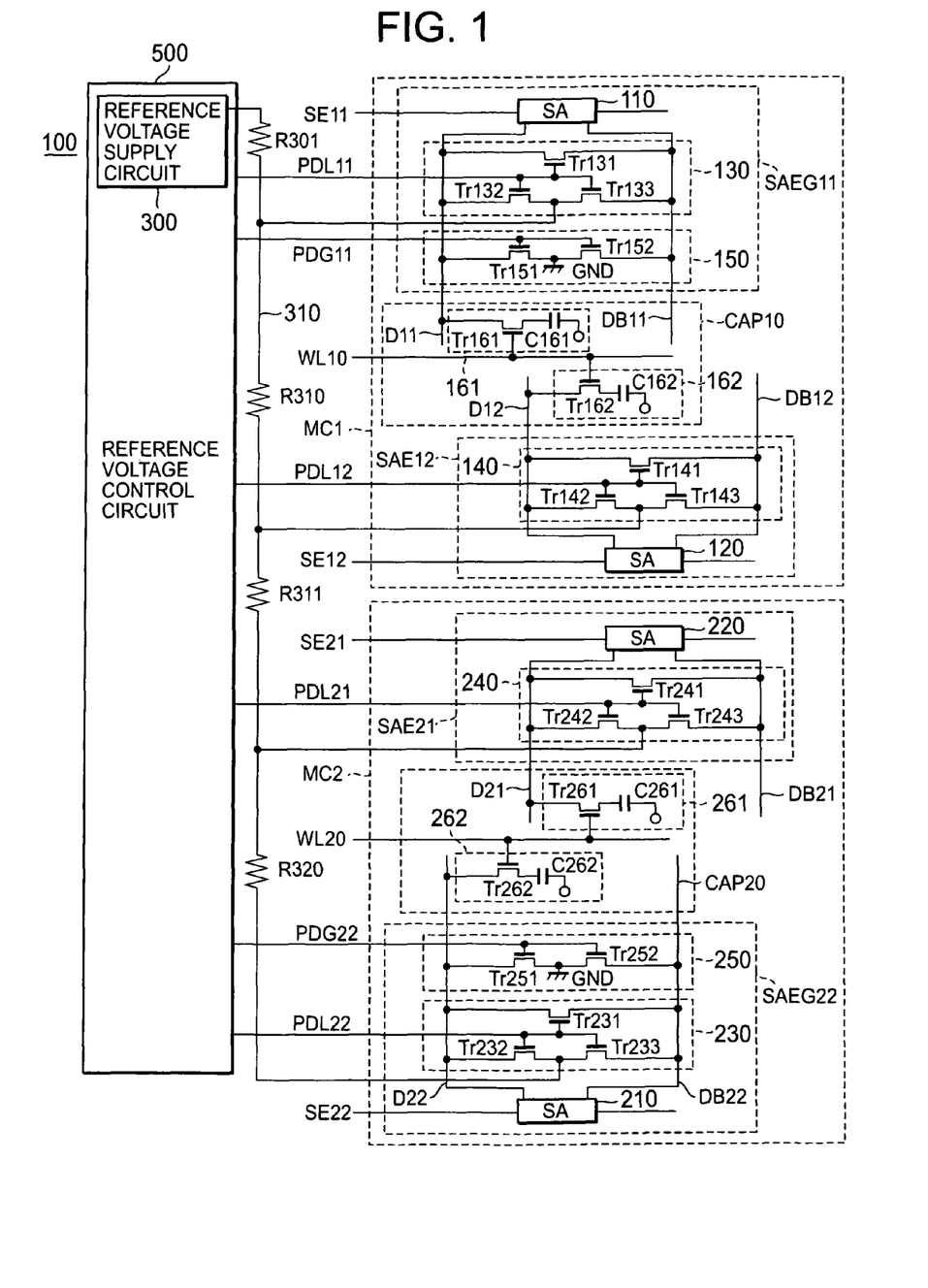
FIG. 1 is an example of a configuration of a semiconductor storage device according to Embodiment 1.

Hereinafter, specific Embodiment 1 to which the present invention is applied will be explained in detail with reference to the accompanying drawings. This Embodiment 1 is a case where the present invention is applied to a DRAM circuit. FIG. 1 shows an example of a configuration of a semiconductor storage device 100 of present Embodiment 1.

As shown in FIG. 1, the semiconductor storage device 100 has memory circuit units MC1 and MC2, and a reference voltage control circuit 500. The reference voltage control circuit 500 has a reference voltage supply circuit 300. Furthermore, the reference voltage control circuit 500 outputs precharge control signals PDL11, PDL12, PDL21 and PDL22 to precharge circuits 130, 140, 240 and 230, which will be described later respectively. Furthermore, the reference voltage control circuit 500 outputs pull-down control signals PDG11 and PDL22 to pull-down circuits 150 and 250 respectively, which will be described later.

The memory circuit unit MC1 has sense amplifier areas SAEG11 and SAE12, and a cell array plate CAP10. The memory circuit unit MC2 has sense amplifier areas SAE21 and SAEG22, and a cell array plate CAP20. The reference voltage supply circuit 300 outputs Vref as a reference voltage and supplies the reference voltage Vref to each sense amplifier area through a reference voltage supply wiring 310. Suppose resistors R301 to R320 are wiring resistors possessed by the reference voltage supply wiring 310 and assumed to have only resistance values of a negligible order in present Embodiment 1.

Here, suppose the "cell array plate" refers to a memory cell group connected to one selected word line. Therefore, when, for example, a word line WL10 connected to the cell array plate CAP10 is selected (word line signal WL10 is driven high), a word line WL20 connected to the cell array plate CAP20 is non-selected (word line signal WL20 remains low). Hereinafter, a cell array plate connected to a selected word line will be referred to as a "selected cell array plate" and a cell array plate connected to any other non-selected word line will be referred to as a "non-selected cell array plate."

The sense amplifier area SAEG11 has a sense amplifier 110, the precharge circuit 130 and the pull-down circuit 150. The sense amplifier 110, precharge circuit 130, pull-down circuit 150 and cell array plate CAP10 are connected to a bit line pair D11, DB11.

The sense amplifier area SAE12 has a sense amplifier 120 and the precharge circuit 140. The sense amplifier 120, precharge circuit 140 and cell array plate CAP10 are connected to a bit line pair D12, DB12.

The cell array plate CAP10 has memory cells 161 and 162. The memory cell 161 has a cell transistor Tr161 and a cell capacitor C161. The memory cell 162 has a cell transistor Tr162 and a cell capacitor C162. The cell transistor Tr161 is connected between the bit line D11 and the cell capacitor C161. The cell transistor Tr162 is connected between the bit line D12 and the cell capacitor C162. The word line signal WL10 is inputted to the respective gates of the cell transistors Tr161 and Tr162. When the word line signal WL10 is driven high, the memory cells 161 and 162 transmit data held to the bit lines D11 and D12 respectively. The word line signal WL10 is a signal whose high level corresponds to VPP, a voltage higher than the power supply voltage VDD and whose low level corresponds to grounding voltage GND. Furthermore, suppose the same will apply to other word line signals.

The sense amplifier 110 amplifies the potential difference between the bit line pair D11, DB11 caused by the data transmitted from the memory cell 161 from the power supply voltage VDD to the grounding voltage GND according to a sense amplifier control signal SE11. The sense amplifier 120 amplifies the potential difference between the bit line pair D12, DB12 caused by the data transmitted from the memory cell 162 from the power supply voltage VDD to the grounding voltage GND according to a sense amplifier control signal SE12. The sense amplifier control signal SE11 is a signal whose high level corresponds to the power supply voltage VDD and whose low level corresponds to the grounding voltage GND. Suppose the same will apply to other sense amplifier control signals.

The precharge circuit 130 has NMOS transistors Tr131 to Tr133. The NMOS transistor Tr131 is connected between the bit line pair D11, DB11. The NMOS transistor Tr132 is connected between the bit line D11 and the reference voltage supply wiring 310. The NMOS transistor Tr133 is connected between the bit line DB11 and the reference voltage supply wiring 310. The precharge control signal PDL11 is inputted to the respective gates of the NMOS transistors Tr131 to Tr133. The precharge control signal PDL11 is a signal whose high level corresponds to the power supply voltage VDD and whose low level corresponds to the grounding voltage GND. Furthermore, suppose the same will apply to other precharge control signals.

When the precharge control signal PDL11 is driven high, the NMOS transistors Tr131 to Tr133 turn ON. Therefore, the bit lines D11 and DB11, and reference voltage supply wiring 310 are short circuited, and precharge operation and equalizing operation are performed. Therefore, the precharge circuit 130 also has the function as an equalizing circuit at the same time. The same will also apply to other precharge circuits.

The precharge circuit 140 has NMOS transistors Tr141 to Tr143. The NMOS transistor Tr141 is connected between the bit line pair D12, DB12. The NMOS transistor Tr142 is connected between the bit line D12 and the reference voltage supply wiring 310. The NMOS transistor Tr143 is connected between the bit line DB12 and the reference voltage supply wiring 310. The precharge control signal PDL12 is inputted to the respective gates of the NMOS transistors Tr141 to Tr143.

When the precharge control signal PDL12 is driven high, the NMOS transistors Tr141 to Tr143 turn ON. Therefore, the bit lines D12 and DB12, and reference voltage supply wiring 310 are short circuited and precharge operation and equalizing operation are performed.

The pull-down circuit 150 has NMOS transistors Tr151 and Tr152. The NMOS transistor Tr151 is connected between the bit line D11 and the grounding voltage GND. NMOS transistor Tr152 is connected between the bit line DB11 and the grounding voltage GND. The pull-down control signal PDG11 is inputted to the respective gates of the NMOS transistors Tr151 and Tr152. The pull-down control signal PDG11 is a signal whose high level corresponds to the power supply voltage VDD and whose low level corresponds to the grounding voltage GND. Furthermore, suppose the same will apply to other pull-down control signals.

When the pull-down control signal PDG11 is driven high, the NMOS transistors Tr151 and Tr152 turn ON. Therefore, the bit lines D11 and DB11 are connected to the grounding voltage GND and fixed to the grounding voltage GND. That is, the charge held in parasitic capacitances of the bit lines D11 and DB11 is discharged.

For simplicity of drawing and explanation of operation, only the memory cells 161 and 162 connected to the word line WL10 are described in the cell array plate CAP10 in FIG. 1. However, not only the memory cells 161 and 162 but also a plurality of memory cells may be further provided in the extending direction of the word line WL10. In such a case, there are bit line pairs, sense amplifiers, precharge circuits and pull-down circuits connected to those memory cells respectively.

The sense amplifier area SAEG22 has a sense amplifier 210, the precharge circuit 230 and the pull-down circuit 250. The sense amplifier 210, precharge circuit 230, pull-down circuit 250 and cell array plate CAP20 are connected to a bit line pair D22, DB22.

The sense amplifier area SAE21 has a sense amplifier 220 and the precharge circuit 240. The sense amplifier 220, precharge circuit 240 and cell array plate CAP20 are connected to a bit line pair D21, DB21.

The cell array plate CAP20 has memory cells 261 and 262. The memory cell 261 has a cell transistor Tr261 and a cell capacitor C261. The memory cell 262 has a cell transistor Tr262 and a cell capacitor C262. The cell transistor Tr261 is connected between the bit line D21 and the cell capacitor C261. The cell transistor Tr262 is connected between the bit line DB22 and the cell capacitor C262. The word line signal WL20 is inputted to the respective gates of the cell transistors Tr261 and Tr262. When the word line signal WL20 is driven high, the memory cells 261 and 262 transmit data held to the bit lines D21 and D22 respectively.

The sense amplifier 210 amplifies the potential difference between the bit line pair D22, DB22 caused by the data transmitted from the memory cell 262 from the power supply voltage VDD to the grounding voltage GND according to a sense amplifier control signal SE22. The sense amplifier 220 amplifies the potential difference between the bit line pair D21, DB21 caused by the data transmitted from the memory cell 261 from the power supply voltage VDD to the grounding voltage GND according to a sense amplifier control signal SE21.

The precharge circuit 230 has NMOS transistors Tr231 to Tr233. The NMOS transistor Tr231 is connected between the bit line pair D22, DB22. The NMOS transistor Tr232 is connected between the bit line D22 and the reference voltage supply wiring 310. The NMOS transistor Tr233 is connected between the bit line DB22 and the reference voltage supply wiring 310. The precharge control signal PDL22 is inputted to the respective gates of the NMOS transistors Tr231 to Tr233.

When the precharge control signal PDL22 is driven high, the NMOS transistors Tr231 to Tr233 turn ON. Therefore, the bit lines D22 and DB22, and reference voltage supply wiring 310 are short circuited, and a precharge operation and equalizing operation are performed.

The precharge circuit 240 has NMOS transistors Tr241 to Tr243. The NMOS transistor Tr241 is connected between the bit line pair D21, DB21. The NMOS transistor Tr242 is connected between the bit line D21 and the reference voltage supply wiring 310. The NMOS transistor Tr243 is connected between the bit line DB21 and the reference voltage supply wiring 310. The precharge control signal PDL21 is inputted to the respective gates of the NMOS transistors Tr1241 to Tr243.

When the precharge control signal PDL21 is driven high, the NMOS transistors Tr241 to Tr243 turn ON. Therefore, the bit lines D21 and DB21, and the reference voltage supply wiring 310 are short circuited, and a precharge operation and equalizing operation are performed.

The pull-down circuit 250 has NMOS transistors Tr251 and Tr252. The NMOS transistor Tr251 is connected between the bit line D22 and the grounding voltage GND. The NMOS transistor Tr252 is connected between the bit line DB22 and the grounding voltage GND. A pull-down control signal PDG22 is inputted to the respective gates of the NMOS transistors Tr251 and Tr252.

When the pull-down control signal PDG22 is driven high, the NMOS transistors Tr251 and Tr252 turn ON. Therefore, the bit lines D22 and DB22 are connected to the grounding voltage GND and fixed to the grounding voltage GND. That is, the charge held in parasitic capacitances of the bit lines D22 and DB22 is discharged.

The cell array plate CAP20 as well as the cell array plate CAP10 may also have a plurality of memory cells in the extending direction of the word line WL20 in addition to the memory cells 261 and 262 and there may also be bit line pairs, sense amplifiers or the like connected to those memory cells.

Figure 2:
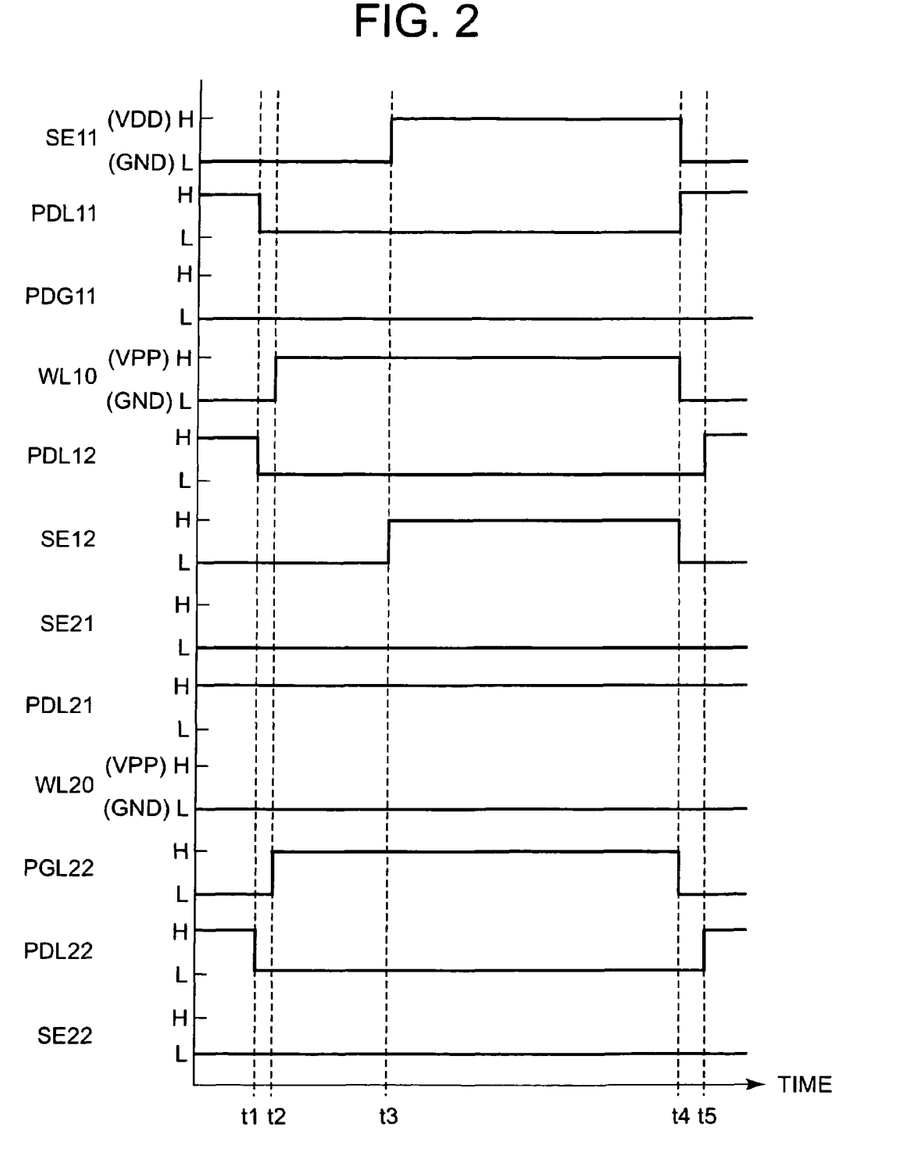
FIG. 2 is a timing chart of operation of the semiconductor storage device according to Embodiment 1.
Figure 3:
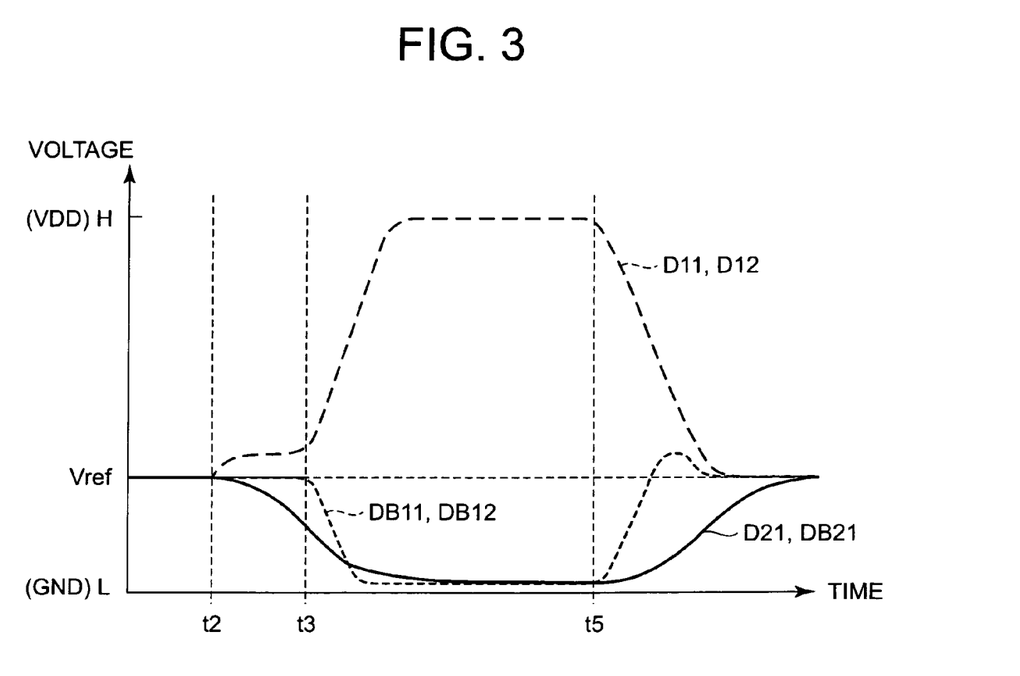
FIG. 3 is a waveform diagram of operation of the semiconductor storage device according to Embodiment 1.

Next, operations of the semiconductor storage device 100 will be explained in detail with reference to the accompanying drawings. FIG. 2 and FIG. 3 show operation timing charts of the semiconductor storage device 100. FIG. 2 shows timing charts of the respective signals and FIG. 3 shows potential levels of the bit lines D11, DB11, D12, DB12, D22 and DB22. Suppose times with an identical reference numeral in FIG. 2 and FIG. 3 represent an identical time. Furthermore, suppose the power supply voltage VDD in FIG. 3 represents "high" of logical level and the grounding voltage GND represents "low" of logical level. Furthermore, in the present embodiment, the memory cells 161 and 162 hold high level data.

First, before time t1, all the precharge control signals PDL11, PDL12, PDL21 and PDL22 are held high. Therefore, all the precharge circuits 130, 140, 230 and 240 are performing a precharge operation and equalizing operation. Thus, all the potentials of the bit line pairs D11, DB11, D21, DB21 and D22, DB22 are the reference voltage Vref.

At time t1, the precharge control signals PDL11, PDL12, and PDL22 are driven low. Therefore, the precharge circuits 130, 140 and 240 stop the precharge operation and equalizing operation.

At time t2, the word line signal WL10 is driven high. Thus, the memory cells 161 and 162 transmit high level data. That is, the charge held in the cell capacitors C161 and 162 are transmitted to the bit lines D11 and D12 and the potentials of the bit lines D11 and D12 slightly rise. The potentials of the bit lines D21 and D22 do not change because the word line signal WL20 remains low. Furthermore, the pull-down control signal 22 is driven high. Thus, the bit line pair D22, DB22 and the grounding potential GND are connected together. Therefore, the potentials of the bit line pair D22, DB22 drop to the grounding voltage GND. The timings at which the word line signal WL10 and the pull-down control signal 22 are driven high need not particularly be the same.

At time t3, the sense amplifier control signals SE11 and SE12 are driven high. Thus, the sense amplifiers 110 and 120 operate and the potential differences between the bit line pair D11, DB11 and between D12, DB12 are amplified. Since high level data is held in the memory cells 161 and 162, the potentials of the bit lines D11 and D12 rise to the power supply voltage VDD, whereas the potentials of the bit lines DB11 and DB12 drop to the grounding potential GND.

At time t4, the word line signal WL10 is driven low. Therefore, the bit lines D11 and D12, and the memory cells 161 and 162 are shut off. Furthermore, the sense amplifier control signals PDL11 and PDL12 are driven low. Thus, the sense amplifiers 110 and 120 stop operating. Furthermore, the pull-down control signal 22 is driven low. Therefore, the bit line pair D22, DB22 and the grounding potential GND are shut off. The timings at which the word line signal WL10, sense amplifier control signals PDL11 and PDL12, and pull-down control signal 22 are driven low need not particularly be the same.

At time t5, the precharge control signals PDL11, PDL12 and PDL22 are driven high again. Therefore, the precharge circuits 130, 140 and 230 perform a precharge operation and equalizing operation. Thus, the bit line pairs D11, DB11, D12, DB12, D21, DB21 and D22, DB22 are connected to the reference voltage supply wiring 310. Therefore, the charge is shared among the bit line pairs D11, DB11, D12, DB12, D21, DB21 and D22, DB22. This charge sharing causes the potentials of the bit lines D11, DB11, D12, DB12, D22 and DB22 to become ⅓ VDD. All the word line signal WL20, sense amplifier control signal SE21 and precharge control signal PDL21 do not change for a period of time t1 to t5. Thus, the bit line pair D21, DB21 remain at the original precharge voltage, that is, the reference voltage Vref. Therefore, if the reference voltage Vref is set to ⅓ VDD, the bit line pair D21, DB21 has little to do with the above described charge sharing and has no variation in potential, either.

Contrary to the above described operation, if the word line WL20 is selected, that is, the cell array plate CAP20 is selected, the bit line pair D11, DB11 of the non-selected cell array plate CAP10 is set to the grounding potential GND by the pull-down circuit 150. After that, the precharge circuits 230, 240 and 130 perform a precharge operation and equalizing operation and the charge is shared among the bit line pairs D11, DB11, D12, DB12, D21, DB21 and D22, DB22 in the same way as the above described operation. As a result, the potentials of the bit lines D11, DB11, D12, DB12, D22 and DB22 become ⅓ VDD in the same way as the above described operation.

As described above, in the conventional semiconductor storage device 10, during precharging and equalizing operations by one selected cell array plate, charge is shared between the bit line pair pulled down to the grounding potential GND and other bit line pairs. Thus, a period such as the period TEQG in FIG. 10 is required. However, the semiconductor storage device 100 of present Embodiment 1 fixes to the grounding potential a predetermined bit line pair of a non-selected cell array plate different from a selected cell array plate whose word line signal is driven high. When precharged and equalized, the bit line pair of the selected cell array plate is connected to the predetermined bit line pair of the non-selected cell array plate fixed to the grounding potential. This eliminates the necessity for a period such as the period TEQG in FIG. 10 of the conventional semiconductor storage device 10 and makes it possible to share charge among bit line pairs and precharge the bit lines to a potential lower than ½ VDD. That is, the semiconductor storage device 100 need not perform any operation of lowering the voltage of the predetermined bit line pair to the grounding voltage by a selected cell array plate. Thus, a period such as the period TEQG, which may cause a delay in one-cycle operation of read/write, is eliminated and there is no more problem in making the semiconductor storage device 100 operate at high speed. Furthermore, precharging the bit line to a low potential in this way allows the high level data holding characteristics of the memory cells to improve.

Furthermore, in the circuit configuration in FIG. 1, the pull-down circuits 150 and 250 cause the bit line pair to drop to the grounding voltage GND through two transistors, but one of the pair of bit lines may be caused to drop to the grounding voltage GND through one transistor. In this case, when charge is shared among the bit line pairs D11, DB11, D12, DB12, D21, DB21 and D22, DB22 through a precharge operation and equalizing operation, the potential of each bit line is precharged to ⅖ VDD. Thus, changing the circuit configuration makes it easier to change the setting of a precharge potential of each bit line.

Furthermore, the conventional semiconductor storage device 10 has the following problems with the circuit layout of the apparatus. In the conventional semiconductor storage device 10, the pull-down circuit 51 and the control circuit for the pull-down circuit 51 in FIG. 9 are arranged for each predetermined number of sense amplifier and precharge groups. Here, in a normal semiconductor storage device, a plurality of sense amplifiers and precharge circuits of the same shape are sequentially arranged in the extending direction of a word line. Therefore, if the pull-down circuits 51 exist in some precharge circuits as in the case of the semiconductor storage device 10, dead spaces may be produced in other precharge circuits having no pull-down circuit. This results in a problem with the circuit of the semiconductor storage device 10 that the area efficiency of the circuit of the chip deteriorates and the circuit scale increases.

However, in the semiconductor storage device 100 of present Embodiment 1, the sense amplifier areas SAEG11 and SAEG22 of the same shape including the pull-down circuits 150 and 250 in FIG. 1 can be sequentially arranged in the extending direction of the word line. This prevents the above described dead spaces from being produced. Thus, it is possible to prevent the area efficiency of the chip from deteriorating and avoid the circuit scale from increasing.

Furthermore, in the above described embodiment, the bit line pair elements of the cell array plate in the extending direction of the bit line pair are connected together to perform the above described charge sharing operation for reasons related to the chip layout. However, instead of the extending direction of the bit line pair, the bit lines of the cell array plate in the extending direction of the word line may be connected together to perform charge sharing. Thus, the semiconductor storage device 100 of present Embodiment 1 has no problem as to the bit line pair of which non-selected cell array plate should be set to the grounding potential GND to perform charge sharing with the bit line pair of the selected cell array plate with respect to the chip layout.

Embodiment 2

Figure 4:
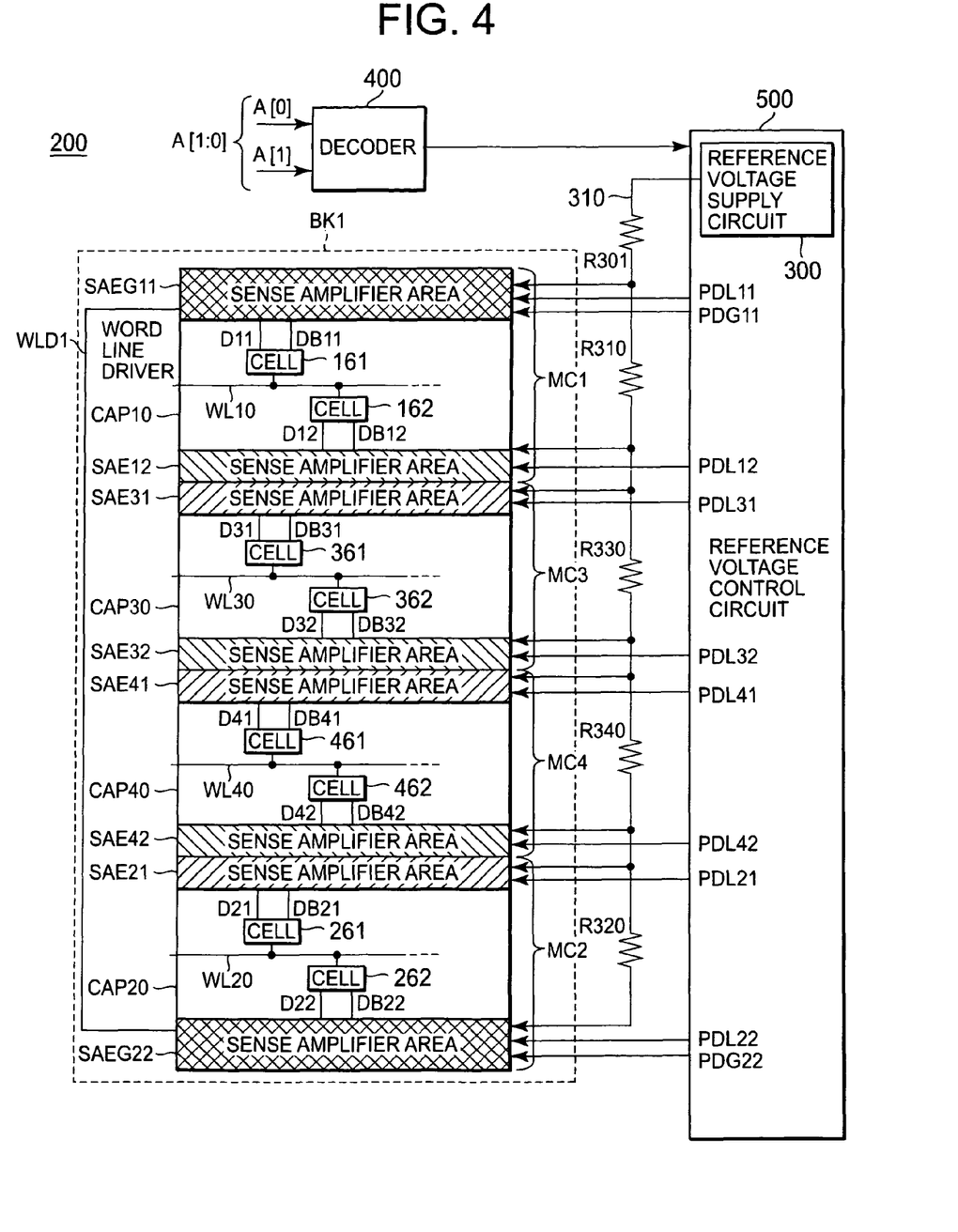
FIG. 4 is an example of a configuration of a semiconductor storage device according to Embodiment 2.

Hereinafter, specific Embodiment 2 to which the present invention is applied will be explained in detail with reference to the accompanying drawings. This Embodiment 2 as well as Embodiment 1 is the case where the present invention is applied to a DRAM circuit. FIG. 4 shows an example of a configuration of a semiconductor storage device 200 of present Embodiment 2. As shown in FIG. 4, the semiconductor storage device 200 has a bank BK1, a reference voltage control circuit 500 and a decoder 400. Present Embodiment 2 will be explained using the bank BK1, which is a single bank.

The reference voltage control circuit 500 has a reference voltage supply circuit 300 in the same way as in Embodiment 1. Furthermore, the reference voltage control circuit 500 outputs pull-down control signals PDG11 and PDG22 to the pull-down circuits of sense amplifier areas SAEG11 and SAEG22 in the same way as in Embodiment 1. Furthermore, the reference voltage control circuit 500 also outputs control signals PDL11, PDL12, PDL21, PDL22, PDL31, PDL32, PDL41 and PDL42 to the precharge circuits of sense amplifier areas SAEG11, SAE12, SAE21, SAEG22, and further sense amplifier areas SAE31, SAE32, SAE41 and SAE42, which will be described later as well. The configurations shown in FIG. 4 assigned the same reference numerals as those in FIG. 1 denote the same as or similar to the configurations shown in FIG. 1.

The bank BK1 has memory circuit units MC1 to MC4. The configurations and connection relationships of the memory circuit units MC1 and MC2 are similar to those in Embodiment 1. The memory circuit unit MC3 has the sense amplifier areas SAE31 and SAE32, and a cell array plate CAP30. The memory circuit unit MC4 has the sense amplifier areas SAE41 and SAE42, and a cell array plate CAP40. A reference voltage supply wiring 310 supplies a reference voltage Vref to each sense amplifier area in the same way as in Embodiment 1. Furthermore, suppose resistors R301 to R340 are wiring resistors possessed by the reference voltage supply wiring 310 and have only resistance values of a negligible order also in present Embodiment 2 in the same way as in the semiconductor storage device 100.

The cell array plates CAP30 and CAP40 have a circuit configuration with a plurality of memory cells in the same way as cell array plate CAP10 or CAP20. For example, the cell array plate CAP30 has memory cells 361 and 362. The cell array plate CAP40 has memory cells 461 and 462.

The sense amplifier areas SAE31, SAE32, SAE41 and SAE42 have circuit configurations similar to the configuration of the sense amplifier area SAE12 or SAE21 with no pull-down circuit. Therefore, the respective precharge circuits (not shown) possessed by the sense amplifier areas SAE31, SAE32 and SAE41, SAE42 are also connected to the reference voltage supply wiring 310 and supplied with the reference voltage Vref. Furthermore, suppose precharge control signals outputted from the reference voltage control circuit 500 and inputted for the precharge circuits (not shown) possessed by the sense amplifier areas SAE31, SAE32, SAE41 and SAE42 to perform a precharge operation are PDL31, PDL32, PDL41 and PDL42 respectively.

A bit line pair D31, DB31 connected to the memory cell 361 of the cell array plate CAP30 is connected to a sense amplifier (not shown) and a precharge circuit (not shown) of the sense amplifier area SAE31. Furthermore, a bit line pair D32, DB32 connected to the memory cell 362 is connected to a sense amplifier and precharge circuit of the sense amplifier area SAE32. Likewise, a bit line pair D41, DB41 connected to the memory cell 461 of the cell array plate CAP40 is connected to a sense amplifier (not shown) and precharge circuit (not shown) of the sense amplifier area SAE41. Furthermore, a bit line pair D42, DB42 connected to the memory cell 462 is connected to a sense amplifier and precharge circuit of the sense amplifier area SAE42.

A word line driver WLD1 drives high any one of word line signals WL10 to WL40 to select a predetermined memory cell in the cell array plates CAP10 to CAP40. Hereinafter, a word line which has been driven high will be referred to as a "selected word line" as required.

As described above, suppose the "bank" in the present Specification refers to a circuit unit having a plurality of cell array plates and their respective sense amplifier areas, in which when one of the plurality of word lines in the bank is selected, all other word lines are non-selected. Therefore, all cell array plates other than the selected cell array plate in one bank are non-selected cell array plates.

The decoder 400 transmits a control signal to the reference voltage control circuit 500 according to a cell array plate selection signal A[1:0] and controls which of the pull-down circuit 150 or 250 should be operated. Here, the cell array plate selection signal A[1:0] is a control signal having a two-bit value to specify one of the four cell array plates CAP10 to CAP40 in the bank BK1 to specify the address of a memory cell. For example, when the word line WL10 is selected (when word line signal WL10 is held high), the cell array plate selection signal A[1:0] becomes "00." Likewise, suppose the cell array plate selection signal A[1:0] becomes "01" when the word line WL30 is selected, "10" when the word line WL40 is selected and "11" when the word line WL20 is selected. In such a case, the decoder 400 judges which of the pull-down circuit 150 or 250 should be operated based on the lower-order bit of the cell array plate selection signal A[1:0]. For example, when the word line WL10 or WL40 is selected, the value of the lower-order bit of the cell array plate selection signal A[1:0] is "0." In this case, the decoder 400 causes the pull-down circuit 250 to operate. On the contrary, when the word line WL30 or WL20 is selected, the value of the lower-order bit of the cell array plate selection signal A[1:0] is "1." In this case, the decoder 400 causes the pull-down circuit 150 to operate.

Hereinafter, operations of the semiconductor storage device 200 will be explained. First, when the word line WL10 is selected, the value of the cell array plate selection signal A[1:0] is "00." In this case, since the lower-order bit of the cell array plate selection signal A[1:0] is "0," the decoder 400 causes the pull-down circuit 250 to operate. That is, when an equalizing operation and precharge operation are performed, charge is shared among the bit lines D11, DB11, D12, DB12, D22 and DB22. The operation in this case is similar to the operation explained in Embodiment 1.

When the word line WL40 is selected, the value of the cell array plate selection signal A[1:0] is "10." In this case, since the lower-order bit of the cell array plate selection signal A[1:0] is "0," the decoder 400 causes the pull-down circuit 250 to operate in the same way as when the word line WL10 is selected. That is, when an equalizing operation and precharge operation are performed, charge is shared among the bit lines D41, DB41, D42, DB42, D22 and DB22.

Next, when the word line WL30 is selected, the value of the cell array plate selection signal A[1:0] is "01." In this case, since the lower-order bit of the cell array plate selection signal A[1:0] is "1," the decoder 400 causes the pull-down circuit 150 to operate. That is, when an equalizing operation and precharge operation are performed, charge is shared among the bit lines D31, DB31, D32, DB32, D11 and DB11.

When the word line WL20 is selected, the value of the cell array plate selection signal A[1:0] is "11." In this case, since the lower-order bit of the cell array plate selection signal A[1:0] is "1," the decoder 400 causes the pull-down circuit 150 to operate in the same way as when the word line WL30 is selected. That is, when an equalizing operation and precharge operation are performed, charge is shared among the bit lines D21, DB21, D22, DB22, D11 and DB11.

As described above, in the semiconductor storage device 200 of Embodiment 2, one cell array plate need not be provided with a sense amplifier area having one pull-down circuit as in the case of the semiconductor storage device 100 of Embodiment 1. That is, a plurality of cell array plates, that is, two or more cell array plates per bank need only to be provided with two sense amplifier areas having a pull-down circuit as in the case of the semiconductor storage device 200.

Furthermore, when the word lines WL10 to WL40 are uniformly selected, the decoder 400 can prevent operation from being biased to one of the two pull-down circuits, that is, the pull-down circuit 150 or 250 in FIG. 4. For example, if the pull-down circuit 250 performs a pull-down operation in all cases other than a case where the word line WL40 is selected, the potentials of the bit line pair D22, DB22 become the grounding potential GND frequently, or to be more specific, with a probability of ¾. In this case, a memory cell 262 connected to the bit line pair D22, DB22 is frequently "disturbed." For this reason, when the memory cell 262 holds high level data, the data holding characteristics may deteriorate. However, as described above, the presence of the decoder 400 allows the pull-down circuits 150 and 250 to operate uniformly and can prevent the disturbance ratio biased to any one of the pair of bit lines.

Here, FIG. 4 shows the case where there are four cell array plates in one bank, but one bank may include a plurality of cell array plates. Each bank needs to have only two sense amplifier areas including a pull-down circuit in this case, too. This makes it possible to suppress the increase in the circuit scale to a minimum. For example, compared to the semiconductor storage device 100 of Embodiment 1, the ratio of the area occupied by the pull-down circuit per unit number of cell array plates of the semiconductor storage device 200 of present Embodiment 2 is ½. Furthermore, when the number of cell array plates per bank is eight, the above described area ratio is ¼. This means that the present embodiment has a greater advantage in preventing an increase in the circuit scale over the conventional semiconductor storage device 10.

The numbers of cell array plates and sense amplifier areas that can be arranged per bank are determined by a maximum value of the wiring resistance between the precharge circuits that perform charge sharing, or to be more specific, determined by the resistance value of the combined resistance of the wiring resistors R310 to R340 in FIG. 4. The following may be cited as the reason for this. When the wiring between the precharge circuits that perform charge sharing increases and the wiring resistance increases, a difference is produced in the potentials of bit lines despite the charge sharing among the bit lines. For this reason, it takes time to cause the voltages of the bit lines lower than the reference voltage Vref to rise to the reference voltage Vref. Therefore, the number of cell array plates is determined depending on the allowable range of the delay corresponding to this time. For example, since the resistance values of the wiring resistors R310 to R340 are normally very small, at least on the order of four cell array plates can be arranged in one bank as in the case of the semiconductor storage device 200.

Furthermore, in FIG. 4, the sense amplifier areas SAEG11 and SAEG22 including the pull-down circuits 150 and 250 are arranged at both ends of the bank for reasons related to the chip layout here. This has the following advantage. In a semiconductor storage device such as a DRAM circuit, cell array plates and sense amplifier areas of the same circuit configuration per bank are normally regularly arranged. For example, as shown in FIG. 4, circuits similar to the sense amplifier area SAE12 and cell array plate CAP10 (sense amplifier areas SAE12 to SAE42, cell array plates CAP20 to CAP40) are arranged neighboring each other. However, unlike the sense amplifier area SAE12 or the like, the sense amplifier areas SAEG11 and SAEG22 have the pull-down circuits 150 and 250. Therefore, arranging the sense amplifier areas SAEG11 and SAEG22 outside, instead of inside the bank, can improve the ease of design.

Figure 5:
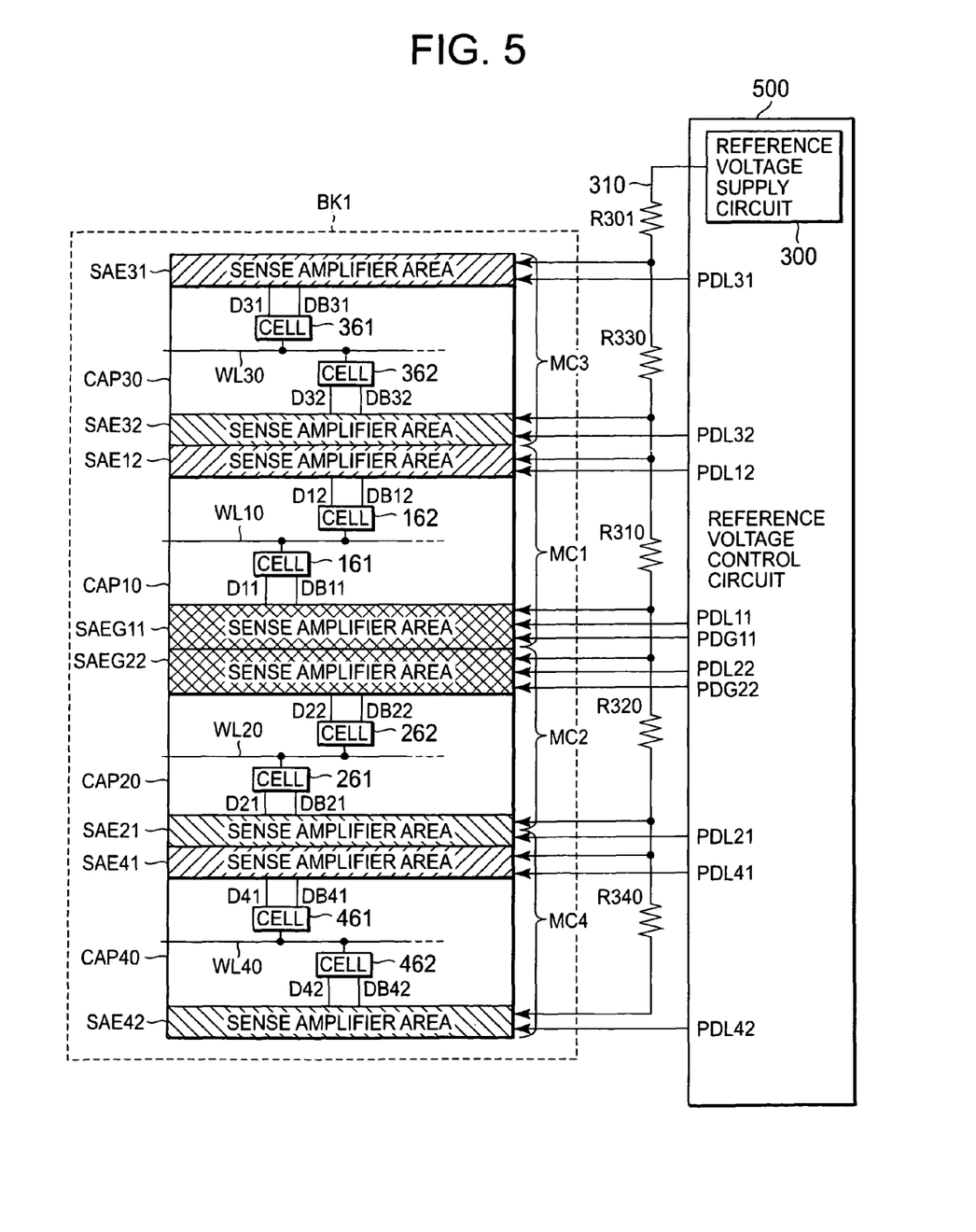
FIG. 5 is an example of a configuration of the semiconductor storage device according to Embodiment 2.

Furthermore, contrary to FIG. 4, as shown in FIG. 5, the sense amplifier areas SAEG11 and SAEG22 including the pull-down circuits 150 and 250 may be arranged in the center of the bank. When the number of cell array plates in one bank increases, this allows wiring between the precharge circuits that perform charge sharing to be shorter than that in the circuit configuration in FIG. 4, or to be more specific, on the order of ½ at maximum. Therefore, although the advantage of the above described ease of design becomes smaller, adverse influences of the wiring resistors R310 to R340 between the precharge circuits that perform charge sharing can be reduced. In this way, it is possible to shorten the precharge time compared to the configuration in FIG. 4 or increase the number of cell array plates in one bank compared to the configuration in FIG. 4.

Figure 6:
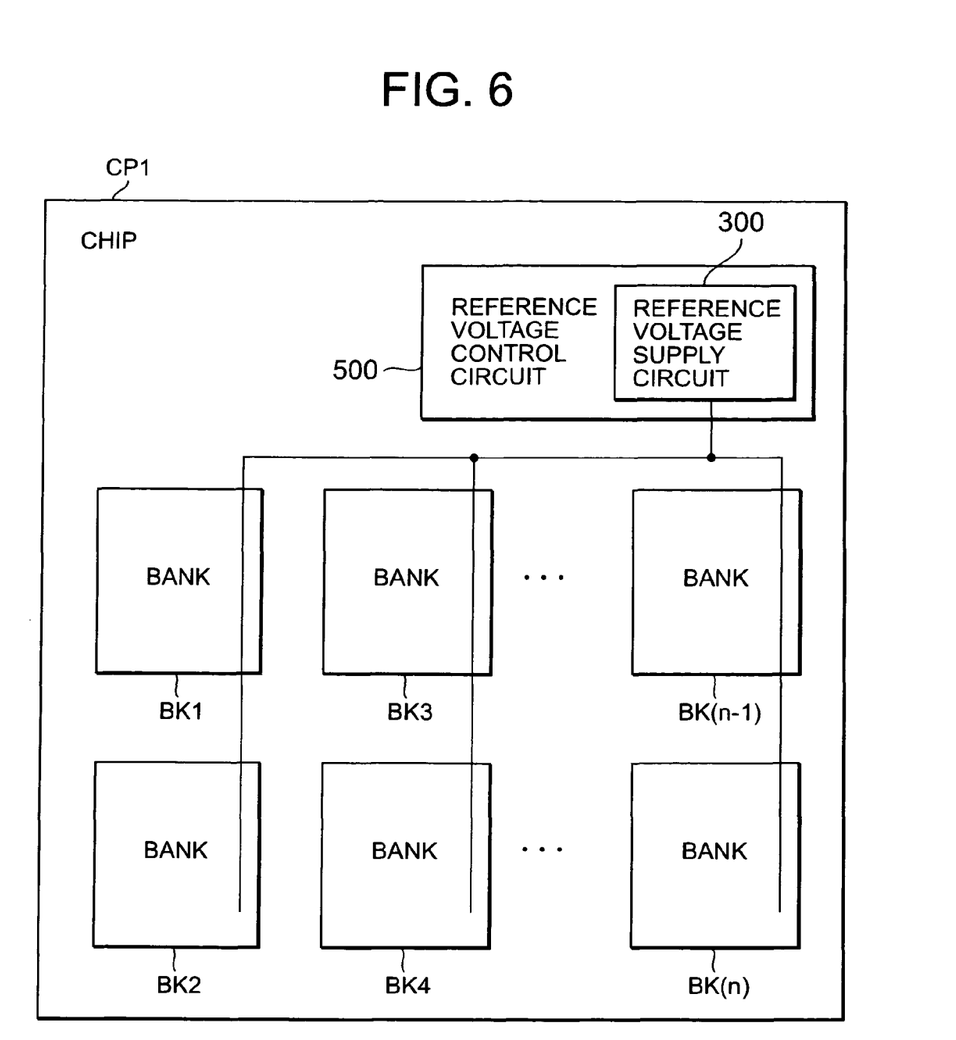
FIG. 6 is an example of a configuration of a semiconductor storage device according to another embodiment.

The present invention is not limited to the above described embodiments, but may be modified as appropriate without departing from the spirit and/or scope of the present invention. For example, Embodiment 2 has explained the configuration with a single bank, but as shown in FIG. 6, it is also possible to adopt a configuration with a plurality of banks (n banks in FIG. 6) further provided with a plurality of banks having a configuration similar to that of the bank BK1 on one chip CP1. When the wiring resistance between banks is sufficiently small, charge may be shared during the above described precharge not only within the bank but also between the banks.

What is claimed is:

1. A semiconductor storage device comprising:
a reference voltage circuit that supplies a reference voltage;
a first memory circuit connected to a first word line; and
a second memory circuit connected to a second word line, that performs a read/write operation when any one of the first memory circuit and the second memory circuit is selected,
wherein the first memory circuit and the second memory circuit each comprise:
a plurality of memory cells;
a plurality of bit line pairs for reading data stored in the plurality of memory cells;
a precharge circuit that connects the reference voltage circuit and the plurality of bit lines to precharge the plurality of bit line pairs;
a sense amplifier circuit that amplifies, when making a selection, potential differences among the plurality of bit line pairs; and
a pull-down circuit that lowers any one of the plurality of bit line pairs to a pull-down voltage, which is lower than the reference voltage,
for a read/write operation period during which the first memory circuit is selected and the second memory circuit is non-selected, the pull-down circuit of the second memory circuit lowers the bit line pair to the pull-down voltage, and
for a precharge period after the read/write operation period, the precharge circuits of the first memory circuit and the second memory circuit connect the plurality of bit line pairs to the reference voltage circuit respectively.

2. The semiconductor storage device according to claim 1, wherein for the precharge period after the read/write operation period, when both precharge circuits of the first memory circuit and the second memory circuit connect a plurality of bit line pairs to the reference voltage circuit, at least one bit line of the bit line pair is connected to the reference voltage circuit.

3. The semiconductor storage device according to claim 1, wherein the pull-down voltage is a grounding voltage.

4. The semiconductor storage device according to claim 1, the semiconductor storage device further comprising a third memory circuit connected to a third word line,
wherein the third memory circuit comprises:
a plurality of memory cells;
a plurality of bit line pairs that read data stored in the plurality of memory cells;
a precharge circuit that connects the reference voltage circuit to the plurality of bit lines and precharges the plurality of bit line pairs; and
a sense amplifier circuit amplifies, when making a selection, potential differences among the plurality of bit line pairs,
for a read/write operation period during which the third memory circuit is selected, and the first memory circuit and the second memory circuit are non-selected, one of the pull-down circuits of the first memory circuit and the second memory circuit lowers the bit line pair to the pull-down voltage, and
for the precharge period after the read/write operation period, one of the precharge circuits of the third memory circuit, the first memory circuit and the second memory circuit connects a plurality of bit line pairs to the reference voltage circuit.

5. The semiconductor storage device according to claim 4, the semiconductor storage device further comprising a control circuit,
wherein the control circuit selects one of the pull-down circuits of the first memory circuit and the second memory circuit and the selected pull-down circuit lowers the bit line pair to the pull-down voltage.

6. The semiconductor storage device according to claim 4, wherein the first memory circuit, the second memory circuit and the third memory circuit are arranged on a same line,
the first memory circuit is provided with a pull-down circuit in a region opposite to a side contacting the third memory circuit, and
the second memory circuit is provided with a pull-down circuit in a region opposite to a side contacting the third memory circuit.

7. The semiconductor storage device according to claim 4, further comprising:
- a plurality of memory cells;
- a plurality of bit line pairs that read data stored in the plurality of memory cells;
- a precharge circuit that connects the reference voltage circuit to the plurality of bit lines and precharges the plurality of bit line pairs; and
- a fourth memory circuit provided with a sense amplifier circuit that amplifies, when making a selection, potential differences among the plurality of bit line pairs,
- wherein the first memory circuit, the second memory circuit, the third memory circuit and the fourth memory circuit are arranged on a same line,
- the first memory circuit and the second memory circuit are arrayed via a region comprising a pull-down circuit respectively, and
- the first memory circuit and second memory circuit are further arranged between the third memory circuit and the fourth memory circuit.

8. A semiconductor storage device comprising:
- a selected first sense amplifier;
- a first bit line pair coupled with the first sense amplifier;
- a first memory cell coupled with any one of the first bit line pair;
- a first word line coupled with the first memory cell;
- a first equalizing circuit coupled with the first bit line pair;
- a non-selected second sense amplifier;
- a second bit line pair coupled with the second sense amplifier;
- a second memory cell coupled with any one of the second bit line pair;
- a second word line coupled with the second memory cell;
- a second equalizing circuit coupled between the second bit line pair;
- a pull-down circuit coupled with the second bit line pair; and
- a control circuit that activates the pull-down circuit before the first sense amplifier is activated and simultaneously activates the first equalizing circuit and the second equalizing circuit for any period other than the period during which the pull-down circuit is activated.

* * * * *